(12) United States Patent
Kim et al.

(10) Patent No.: US 10,825,666 B2
(45) Date of Patent: Nov. 3, 2020

(54) PLASMA MONITORING APPARATUS AND PLASMA PROCESSING SYSTEM

(71) Applicant: SAMSUNG ELECTRONICS CO., LTD., Suwon-si (KR)

(72) Inventors: Kyeong-Hun Kim, Hwaseong-si (KR); Jeong-Il Mun, Hwaseong-si (KR); Hyung-Joo Lee, Hwaseong-si (KR); Jong-Woo Sun, Hwaseong-si (KR); Dong-Kyu Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 53 days.

(21) Appl. No.: 16/395,532

(22) Filed: Apr. 26, 2019

(65) Prior Publication Data

US 2020/0066499 A1   Feb. 27, 2020

(30) Foreign Application Priority Data

Aug. 27, 2018   (KR) .......................... 10-2018-0100130

(51) Int. Cl.
| | |
|---|---|
| *H01J 37/32* | (2006.01) |
| *G01J 3/02* | (2006.01) |
| *G01J 3/443* | (2006.01) |
| *G01N 21/68* | (2006.01) |
| *G01N 21/73* | (2006.01) |

(52) U.S. Cl.
CPC ....... *H01J 37/32972* (2013.01); *G01J 3/0208* (2013.01); *G01J 3/443* (2013.01); *G01N 21/68* (2013.01); *G01N 21/73* (2013.01)

(58) Field of Classification Search
CPC ..................................................... G01N 21/73
See application file for complete search history.

(56) References Cited

U.S. PATENT DOCUMENTS

| | | | | |
|---|---|---|---|---|
| 4,575,241 A | * | 3/1986 | Demers | G01N 21/6404 356/307 |
| 4,591,267 A | * | 5/1986 | Demers | G01N 21/73 356/316 |
| 5,436,723 A | * | 7/1995 | Kunselman | G01J 3/20 356/307 |

(Continued)

FOREIGN PATENT DOCUMENTS

| | | |
|---|---|---|
| KR | 10-2013-0050098 A | 5/2013 |
| KR | 10-1335011 B1 | 12/2013 |

(Continued)

*Primary Examiner* — Shawn Decenzo
(74) *Attorney, Agent, or Firm* — Sughrue Mion, PLLC

(57) ABSTRACT

Provided is a plasma monitoring apparatus including an objective lens configured to collect light that is emitted from plasma and passes through an optical window of a chamber, a beam splitter configured to divide the light collected by the objective lens into first light and second light, a first optical system and a second optical system that are provided on a first optical path of the first light and a second optical path of the second light, respectively, the first optical system and the second optical system having different focal lengths such that focal points of the first optical system and the second optical system are set at different regions in the plasma, and a light detector configured to detect the first light that has passed through the first optical system and the second light that has passed through the second optical system.

20 Claims, 7 Drawing Sheets

(56) References Cited

U.S. PATENT DOCUMENTS

| | | | | |
|---|---|---|---|---|
| 5,777,734 | A | * | 7/1998 | Flower ............... G01N 15/1012 356/341 |
| 5,986,277 | A | * | 11/1999 | Bourque ............... G01J 5/0014 250/554 |
| 6,012,326 | A | * | 1/2000 | Raybone ............... G01N 21/73 422/186.21 |
| 6,399,915 | B1 | * | 6/2002 | Mori ....................... B23K 26/03 219/121.83 |
| 6,677,604 | B2 | * | 1/2004 | Mitrovic ............... G01N 21/68 250/226 |
| 9,080,982 | B1 | * | 7/2015 | Asprey ................. G01J 3/0237 |
| 9,091,595 | B2 | | 7/2015 | Asakura et al. |
| 9,330,990 | B2 | | 5/2016 | Chen et al. |
| 9,500,524 | B2 | * | 11/2016 | Matsuzawa ........... G01N 21/73 |
| 9,653,874 | B1 | * | 5/2017 | Asprey .................. G01S 17/89 |
| 9,970,818 | B2 | * | 5/2018 | Bao ........................ G01N 21/31 |
| 10,002,804 | B2 | | 6/2018 | Chen et al. |
| 10,215,704 | B2 | * | 2/2019 | Han ........................ G01N 21/73 |
| 10,281,406 | B1 | * | 5/2019 | Russo .................... G01N 33/02 |
| 2002/0139925 | A1 | * | 10/2002 | Mitrovic ............... G01N 21/68 250/226 |
| 2004/0026035 | A1 | * | 2/2004 | Mitrovic ........... H01J 37/32972 156/345.24 |
| 2016/0202237 | A1 | * | 7/2016 | Zeng ................. B01L 3/502715 435/29 |
| 2016/0290862 | A1 | | 10/2016 | Ikku |
| 2016/0379802 | A1 | | 12/2016 | Oh et al. |
| 2017/0067779 | A1 | * | 3/2017 | Kim ....................... G02B 5/205 |
| 2017/0254755 | A1 | * | 9/2017 | Cho ........................ G01N 21/73 |

FOREIGN PATENT DOCUMENTS

| | | |
|---|---|---|
| KR | 10-1571928 B1 | 11/2015 |
| KR | 10-1780874 B1 | 9/2017 |

* cited by examiner

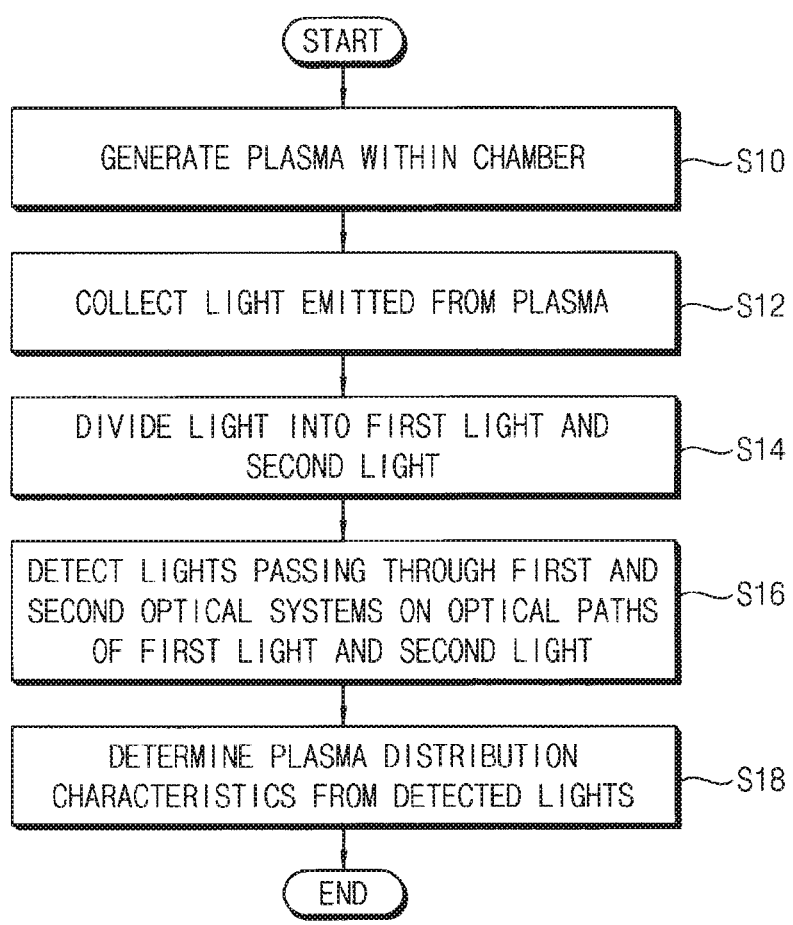

PLASMA MONITORING APPARATUS AND PLASMA PROCESSING SYSTEM

PRIORITY STATEMENT

This application claims priority from Korean Patent Application No. 10-2018-0100130, filed on Aug. 27, 2018 in the Korean Intellectual Property Office (KIPO), the disclosure of which is herein incorporated by reference in its entirety.

BACKGROUND

1. Field

Example embodiments relate to a plasma monitoring apparatus and a plasma processing system. More particularly, example embodiments relate to a substrate support apparatus for supporting a wafer within a plasma chamber and a plasma processing apparatus including the same.

2. Description of the Related Art

An optical emission spectrometer (OES) may spectrally separate an incoming light to analyze an intensity of the light based on wavelengths. The OES may be used to analyze and diagnose plasma process characteristics within a chamber of semiconductor manufacturing equipment. However, since only bulk plasma over a wafer is observed, plasma distribution or variation across the wafer cannot be detected.

SUMMARY

One or more example embodiments provide a plasma monitoring apparatus capable of precisely analyzing plasma distribution over a wafer.

Further one or more example embodiments provide a plasma monitoring system including the plasma monitoring apparatus.

Further still, one or more example embodiments provide a plasma monitoring method using the plasma monitoring apparatus.

According to an aspect of an example embodiment, there is provided a plasma monitoring apparatus including an objective lens configured to collect light that is emitted from plasma and passes through an optical window of a chamber, a beam splitter configured to divide the light collected by the objective lens into first light and second light, a first optical system and a second optical system that are provided on a first optical path of the first light and a second optical path of the second light, respectively, the first optical system having a first focal length and the second optical system having a second focal length that is different from the first focal length such that focal points of the first optical system and the second optical system are set at different regions in the plasma, and a light detector configured to detect the first light that has passed through the first optical system and the second light that has passed through the second optical system.

According to an aspect of an example embodiment, there is provided a plasma processing system including a chamber including a space to perform a plasma process on a substrate and a wall including an optical window, and a plasma monitoring apparatus configured to monitor a light that is emitted from plasma and passes through the optical window, the plasma monitoring apparatus including a beam splitter configured to divide the light into first light and second light, a first optical system and a second optical system that are provided on a first optical path of the first light and a second optical path of the second light, respectively, the first optical system having a first focal length and the second optical system having a second focal lengths that is different from the first focal length such that focal points of the first optical system and the second optical system are set at different regions in the plasma, and a light detector configured to detect the first light that has passed through the first optical system and the second light that has passed through the second optical system.

According to an aspect of an example embodiment, there is provided a plasma monitoring method including generating plasma within a chamber, collecting, through an objective lens, light that is emitted from the plasma and passes through an optical window of the chamber, dividing the light collected through the objective lens into first light and second light, transmitting the first light through a first optical system provided on a first optical path of the first light and transmitting the second light through a second optical system provided on a second optical path of the second light, and detecting, by a light detector, the first light that has been transmitted through the first optical system and the second light that has been transmitted through the second optical system.

BRIEF DESCRIPTION OF THE DRAWINGS

The above and/or other aspects will become apparent and more readily appreciated from the following description of example embodiments, taken in conjunction with the accompanying drawings in which:

FIG. 7 is a flow chart illustrating a plasma monitoring method according to example embodiments.

DETAILED DESCRIPTION OF EXAMPLE EMBODIMENTS

Hereinafter, example embodiments will be explained in detail with reference to the accompanying drawings.

Figure 1:
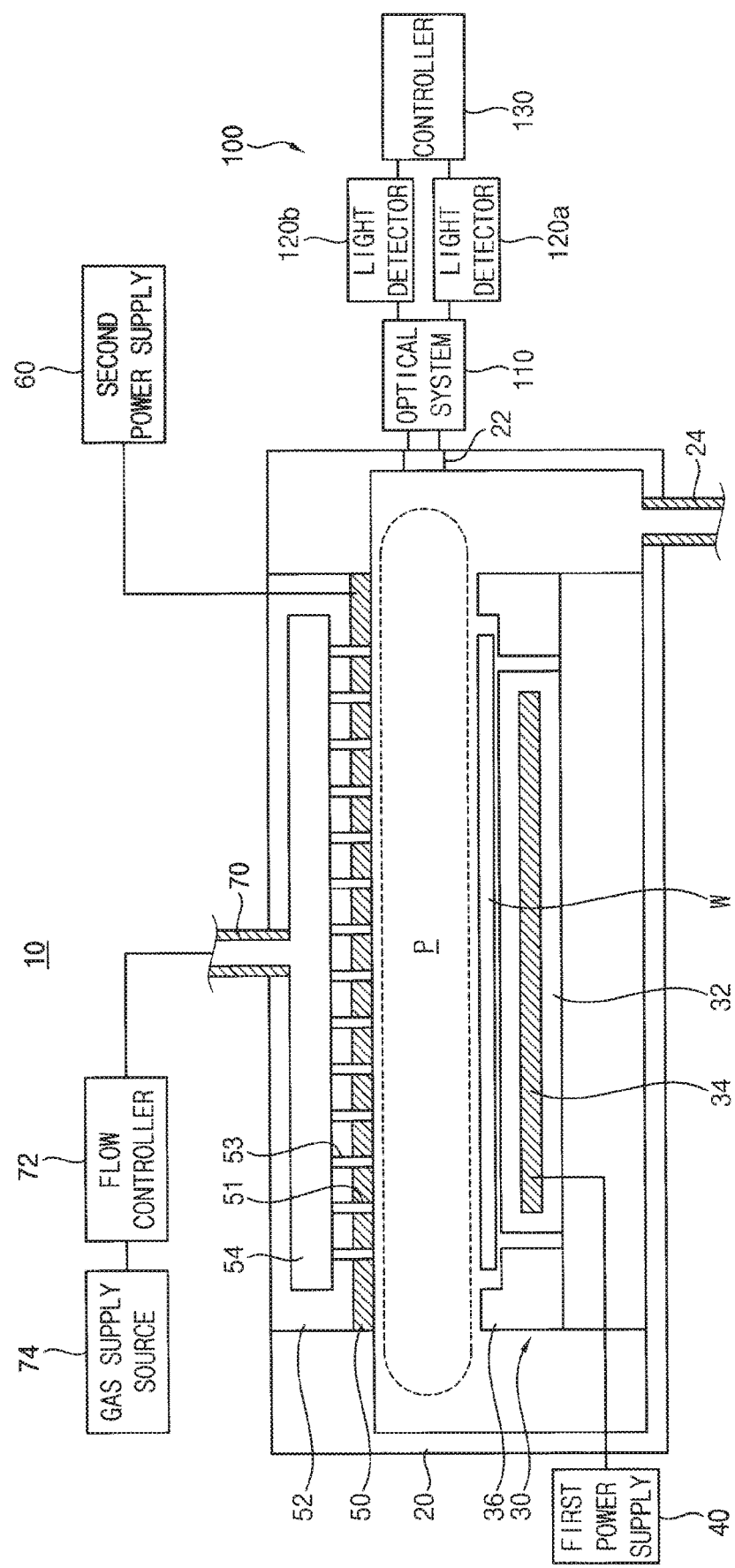
FIG. 1 is a block diagram illustrating a plasma processing system according to an example embodiment.
Figure 2:
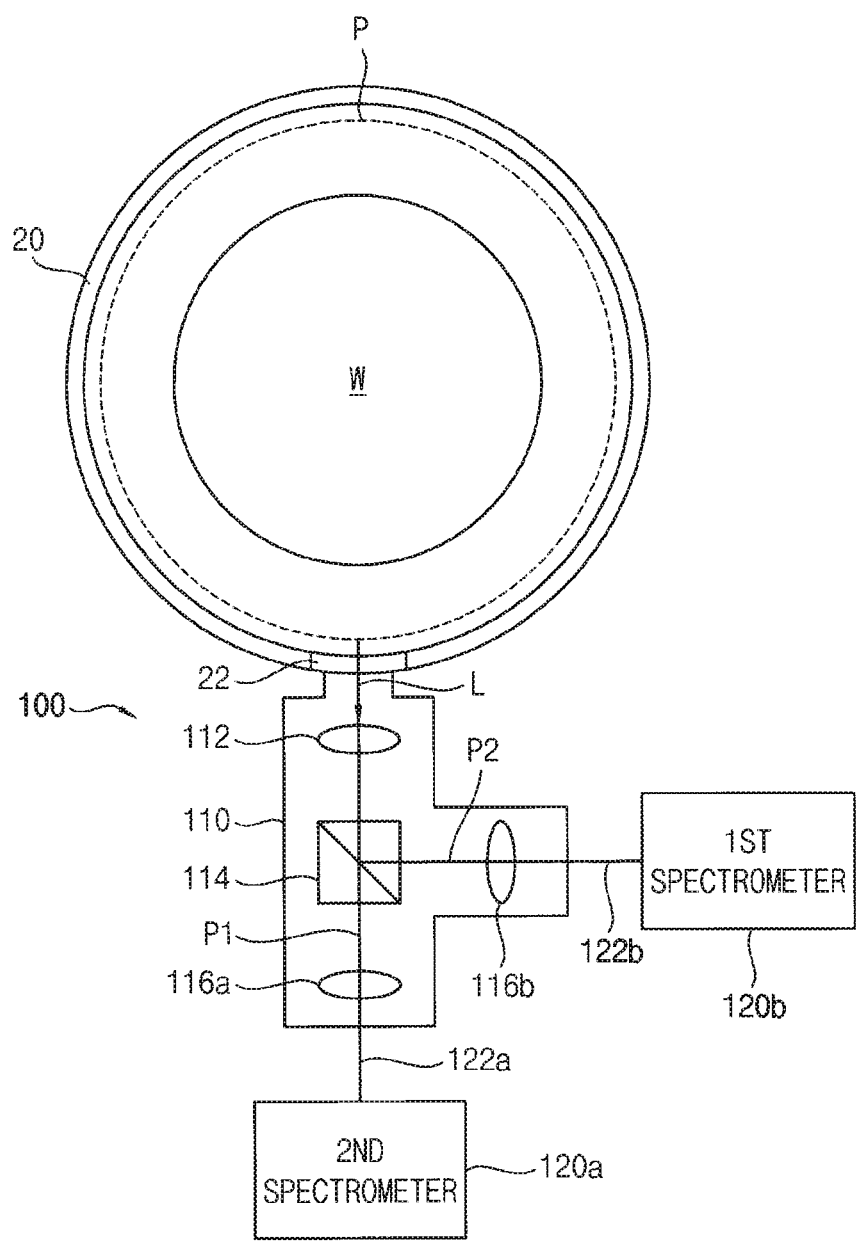
FIG. 2 is a plan view illustrating a plasma monitoring apparatus in FIG. 1.
Figure 3:
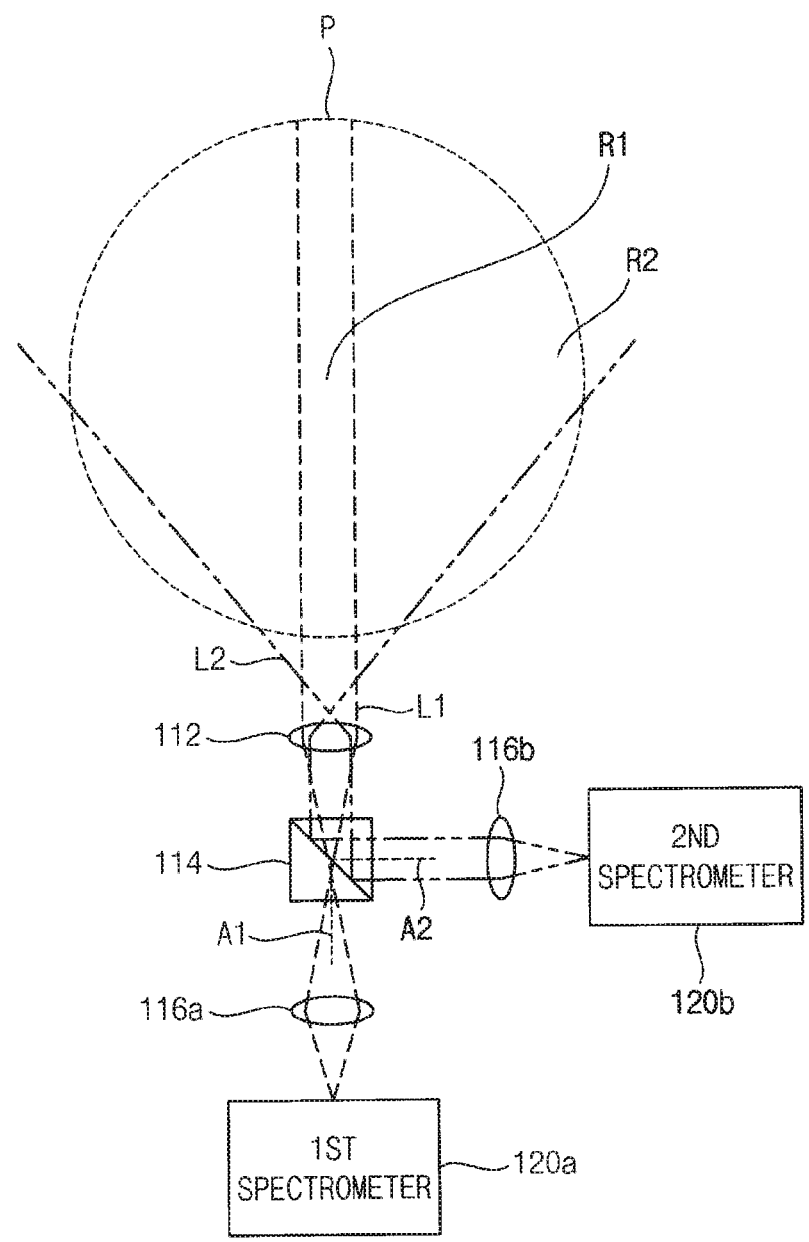
FIG. 3 is a view illustrating light paths of light passing through first optical system and second optical system of the plasma monitoring apparatus in FIG. 2.
Figure 4:
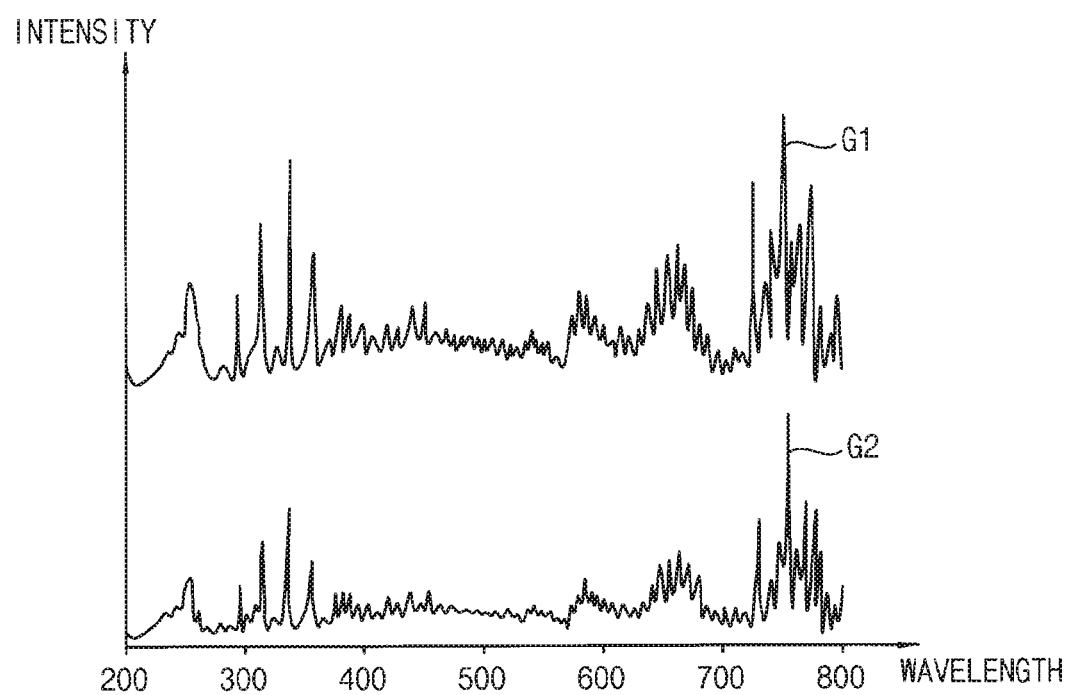
FIG. 4 is graphs illustrating spectra of the light after passing through the first optical system and second optical system of FIG. 3.

FIG. 1 is a block diagram illustrating a plasma processing system according to an example embodiment. FIG. 2 is a plan view illustrating a plasma monitoring apparatus in FIG. 1. FIG. 3 is a view illustrating light paths of lights collected through a first optical system and a second optical system of the plasma monitoring apparatus in FIG. 2. FIG. 4 is graphs illustrating spectra of the light after passing through the first optical system and the second optical system as illustrated in FIG. 3.

Referring to FIGS. 1, 2, 3, and 4, a plasma processing system may include a plasma processing apparatus 10 and a plasma monitoring apparatus 100

In example embodiments, the plasma processing apparatus 10 may include a chamber 20, a substrate stage 30 having a lower electrode 34, an upper electrode 50, a first power supply 40, and a second power supply 60. The plasma processing apparatus 10 may further include a gas supply unit, an exhaust unit, etc.

In example embodiments, the plasma processing apparatus 10 may be an apparatus configured to etch a layer on a substrate such as a semiconductor wafer W disposed within the capacitively coupled plasma (CCP) chamber. However, the plasma generated by the plasma processing apparatus 10 may not be limited to the capacitively coupled plasma, and, for example, inductively coupled plasma, microwave plasma, etc. may be generated by the plasma processing apparatus 10. Additionally, the plasma processing apparatus 10 may not be limited to the etching apparatus, and, for example, may be used for a deposition apparatus, a cleaning apparatus, etc. Here, the substrate may include a semiconductor substrate, a glass substrate, etc.

The substrate stage 30 may be arranged within the chamber 20 to support the substrate. For example, the substrate stage 30 may serve as a susceptor for supporting the wafer W thereon. The substrate stage 30 may include a support plate 32 having an electrostatic electrode for holding the wafer W using electrostatic force.

The substrate stage 30 may include the circular plate-shaped lower electrode 34 in the support plate 32. The lower electrode 34 may be installed to be movable upwardly and downwardly by a driving portion. The substrate stage 30 may include a focus ring 36 which is arranged along a circumference of the support plate 32 to surround the wafer W. The focus ring 36 may have a ring shape.

A gate for a loading and unloading of the wafer W may be provided in a sidewall of the chamber 20. The wafer W may be loaded onto and unloaded from the substrate stage 30 through the gate.

The exhaust unit may be connected to an exhaust port 24 which is installed in a bottom portion of the chamber 20, through an exhaust line. The exhaust unit may include a vacuum pump such as a turbo-molecular pump or the like, to control a pressure of the chamber 20 so that a processing space inside the chamber 20 may be depressurized to a desired vacuum level. Additionally, process by-products and residual process gases may be discharged through the exhaust port 24.

The upper electrode 50 may be disposed over the substrate stage 30 such that the upper electrode 50 faces the lower electrode 34. The chamber space between the upper electrode 50 and the lower electrode 34 may be used as a plasma generation region. The upper electrode 50 may have a surface that faces the wafer W on the substrate stage 30.

The upper electrode 50 may be supported in an upper portion of the chamber 20 by an insulation shield member. The upper electrode 50 may be provided as a part of a shower head for supplying a gas into the chamber 20. The upper electrode 50 may have an electrode plate having a circular shape. The upper electrode 50 may include a plurality of injection holes 51 which are formed to penetrate through the upper electrode 50 to supply the gas into the chamber 20.

In particular, the shower head may include an electrode support plate 52 which supports the upper electrode 50 and diffuses the gas such that the gas is injected through the injection holes 51 of the upper electrode 50. The electrode support plate 52 may include a gas diffusion chamber 54 therein, and gas passages 53 may be formed in the gas diffusion chamber 54 to be connected to the injection holes 51. The upper electrode 50 may be installed detachably to a lower surface of the electrode support plate 52. The electrode support plate 52 may include a conductive material such as aluminum, and may have a water cooling channel therein.

The gas supply unit may include a gas supply line 70, a flow controller 72 and a gas supply source 74, such as gas supply elements. The gas supply line 70 may be connected to the gas diffusion chamber 54 of the electrode support plate 52, and the flow controller 72 may control a supply amount of the gas supplied into the chamber 20 through the gas supply line 70. For example, the gas supply source 74 may include a plurality of gas tanks, and the flow controller 72 may include a plurality of mass flow controllers (MFCs) corresponding to the gas tanks. The plurality of mass flow controllers may independently control the supply amount of the gas.

The first power supply 40 and the second power supply 60 may apply a radio frequency power to the lower electrode 34 and the upper electrode 50 to form the plasma P within the chamber 20. A controller may be connected to the first power supply 40 and the second power supply 60, and control operations thereof. The controller having a microcomputer and various interface circuits may control an operation of the plasma processing apparatus 10 based on programs and recipe information stored in an external memory or internal memory.

In example embodiments, an optical window 22 for optical access to the plasma processing chamber may be provided in a sidewall of the chamber 20. The optical window 22 may include a material such as, for example, glass, quartz, fused silica, or sapphire, depending on the application and the chemical action of the plasma. The plasma P may emit light of wavelengths that are characteristic of the species present in the etch chemistry. The light emitted from the plasma P may be emitted to the outside through the optical window 22.

The plasma monitoring apparatus 100 may be installed adjacent to the optical window 22 of the chamber 20. The plasma monitoring apparatus 100 may monitor the light L emitting from the plasma P through the optical window 22 of the chamber 20.

As illustrated in FIGS. 1 and 2, the plasma monitoring apparatus 100 may include a light receiving optical system 110 to receive the light L generated from the plasma P and light detectors 120a and 120b to detect the light collected through the optical system 110. Additionally, the plasma monitoring apparatus 100 may further include a controller 130 configured to process signals detected by the light detectors 120a and 120b and provide distribution information of the plasma P.

Referring to FIG. 2, the light receiving optical system 110 may include a beam splitter 114 to divide the light L generated from the plasma P into a first light and a second light, and a first optical system and a second optical system arranged respectively on a first optical path P1 of the first light and a second optical path P2 of the second light, and having different focal lengths such that focal points of the first optical system and the second optical system are set at different regions within the plasma P.

The light receiving optical system 110 may include an objective lens 112 to collect the light L generated from the plasma P. For example, the objective lens 112 may include a convex lens. The beam splitter 14 may divide the light collected through the objective lens 112 into the first light L1 and the second light L2. The beam splitter 114 may be an optical device configured to split a beam of an incident light in two at a desired ratio. Accordingly, the beams splitter may be replaced with another optical device that may split a beam of light in two.

The beam splitter 114 may be arranged along a first axis A1 downstream from the objective lens 112 to split the optical path into two, a first optical path P1 and a second optical path P2. The first optical path P1 may extend along the first axis A1 and the second optical path P2 may extend along a second axis A2 as illustrated in FIG. 3. For example, the beam splitter 114 may include a cube or a plate.

The first optical system may be arranged on the first optical path P1 of the first light L1, and the second optical system may be arranged on the optical path P2 of the second light L2. The first optical system may include a first optical lens 116*a* configured to have a first focal length f1 together with the objective lens 112, and the second optical system may include a second optical lens 116*b* configured to have a second focal length f2, different from the first focal length f1, together with the objective lens 112. For example, the first optical lens 116*a* may be a convex lens, and the second optical lens 116*b* may be a convex lens. However, the first optical lens and the second optical lens are not be limited thereto, and the first optical lens and the second optical lens may include one or more optical lenses, for example, a convex lens, a concave lens, a focus adjusting optical elements, etc., configured to have different focal lengths.

As illustrated in FIG. 3, the first optical system may collect a light L1 emitting from a first region, for example, a central region R1 corresponding to the diameter within the plasma P, and the second optical system may collect a light L2 emitting from a second region, for example, a peripheral region R2 within the plasma P. The first optical system may collect the first light L1 from the central region R1 of the plasma P at a first viewing angle with respect to an imaginary central line extending through the optical window 22 of the chamber 20, and the second optical system may collect the second light L2 from the peripheral region R2 of the plasma P at a second viewing angle greater than the first viewing angle.

The light detector may include a first spectrometer 120*a* to analyze the light passing through the first optical system and a second spectrometer 120*b* to analyze the light passing through the second optical system. The first spectrometer 120*a* and the second spectrometer 120*b* may include an optical emission spectrometer (OES).

The light converged by the first optical lens 116*a* may be transmitted to the first spectrometer 120*a* through a first light fiber 122*a*, and the light converged by the second optical lens 116*b* may be transmitted to the second spectrometer 120*b* through a second light fiber 122*b*. The first spectrometer 120*a* and the second spectrometer 120*b* may spectrally separate the incoming lights based on wavelengths, and identify concentration levels of gases within the chamber 20.

As illustrated in FIG. 4, graph G1 represents spectrum analyzed by the first spectrometer 120*a*, and graph G2 represents spectrum analyzed by the second spectrometer 120*b*. The controller 130 may process the signals detected by the first spectrometer 120*a* and the second spectrometer 120*b* to determine distribution state of the plasma P and provide the distribution information.

As mentioned above, the plasma monitoring apparatus 100 may include the beam splitter 114 to divide the light L emitted from the plasma P into a first light L1 and a second light L2, the first optical system and the second optical system arranged respectively on the first optical path of the first light and the second optical path of the second light, and having different focal lengths such that focal points of the first optical system and the second optical system are set at different regions within the plasma P, and a first light detector and a second light detector to detect the light passing through the first optical system and the light passing through the second optical system, respectively.

Accordingly, the light emitted from the plasma and passing through the optical window 22 may be divided into at least two lights and the at least two lights may be analyzed by two optical systems having different focal lengths, and thus plasma information in different regions over the wafer may be obtained to thereby more precisely identify plasma distribution.

Further, a construction of the light receiving optical system 110 may be simplified by using the beam splitter 114, and only the light passing through the single optical window 22 may be analyzed to prevent or reduce a clouding noise generated when light passing through different optical windows are detected.

Figure 5:
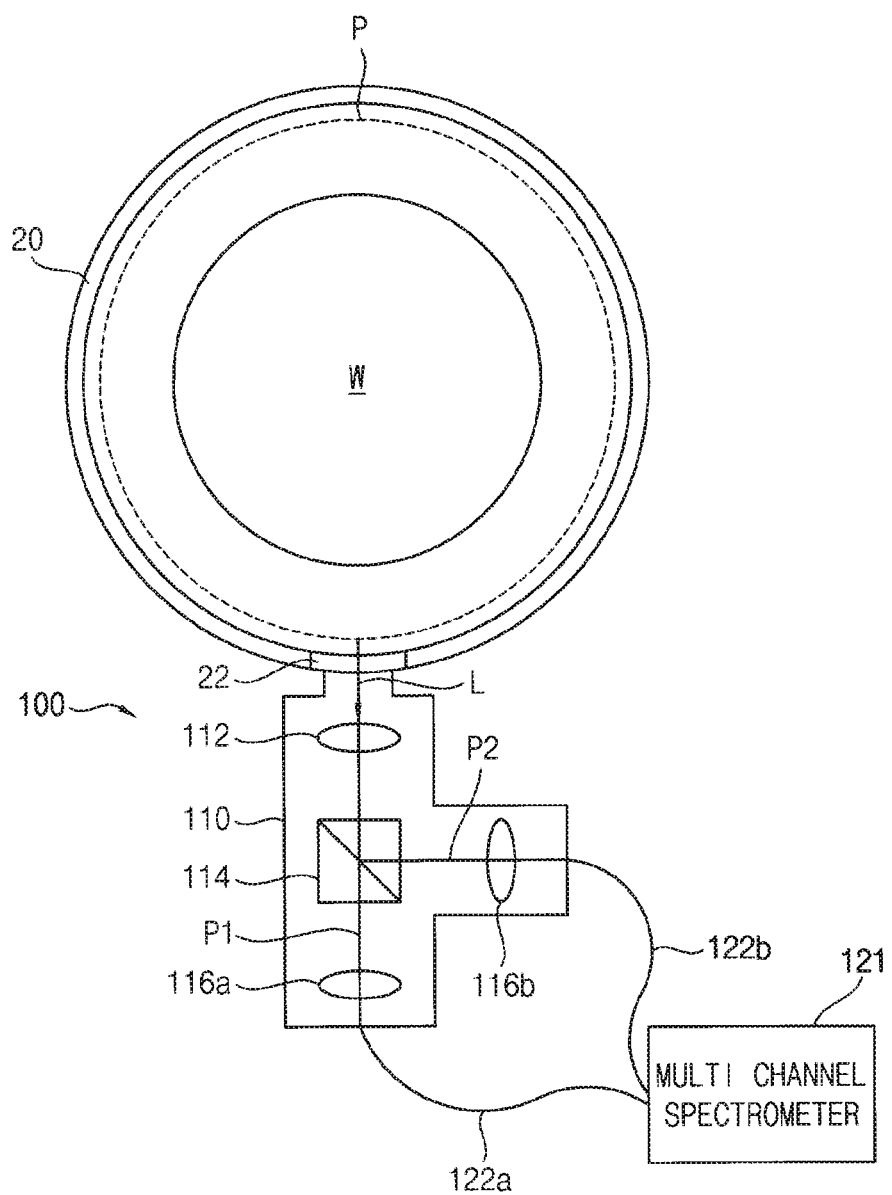
FIG. 5 is a plan view illustrating a plasma monitoring apparatus in according to an example embodiment.

FIG. 5 is a plan view illustrating a plasma monitoring apparatus according to an example embodiment. The plasma monitoring apparatus may be substantially the same as or similar to the plasma monitoring apparatus described with reference to FIGS. 1 to 3 except for a configuration of a light detector. Thus, same reference numerals will be used to refer to the same or like elements and any further repetitive explanation concerning the above elements will be omitted.

Referring to FIG. 5, a plasma monitoring apparatus may include an objective lens 112 to collect a light L emitted from plasma P and passing through an optical window 22, a beam splitter 114 to divide the collected light L into a first light and a second light, first optical system and second optical system arranged respectively in first optical path P1 and second optical path P2 of the first light and second light and having different focal lengths such that focal points of the first optical system and the second optical system are set at different regions within the plasma P, and a light detector to detect light passing through the first optical system and the second optical system, respectively.

In example embodiments, the first optical system may include a first optical lens 116*a* which is configured to have a first focal length f1 together with the objective lens 112, and the second optical system may include a second optical lens 116*b* which is configured to have a second focal length f2, different from the first focal length f1, together with the objective lens 112. The light detector may include a multi channel spectrometer 121 to analyze the light passing through the first optical system and light passing through the second optical system.

The light converged by the first optical lens 116*a* may be transmitted to the multi channel spectrometer 121 through a first light fiber 122*a*, and the light converged by the second optical lens 116*b* may be transmitted to the multi channel spectrometer 121 through a second light fiber 122*b*.

Since plasma optical emission spectra in different regions over the wafer are collected at the same time by the first optical system and the second optical system, the multi channel spectrometer 121 may be more suitable for high speed analysis. Further, the number of the optical emission spectrometers (OESs) may be reduced or minimized.

Figure 6:
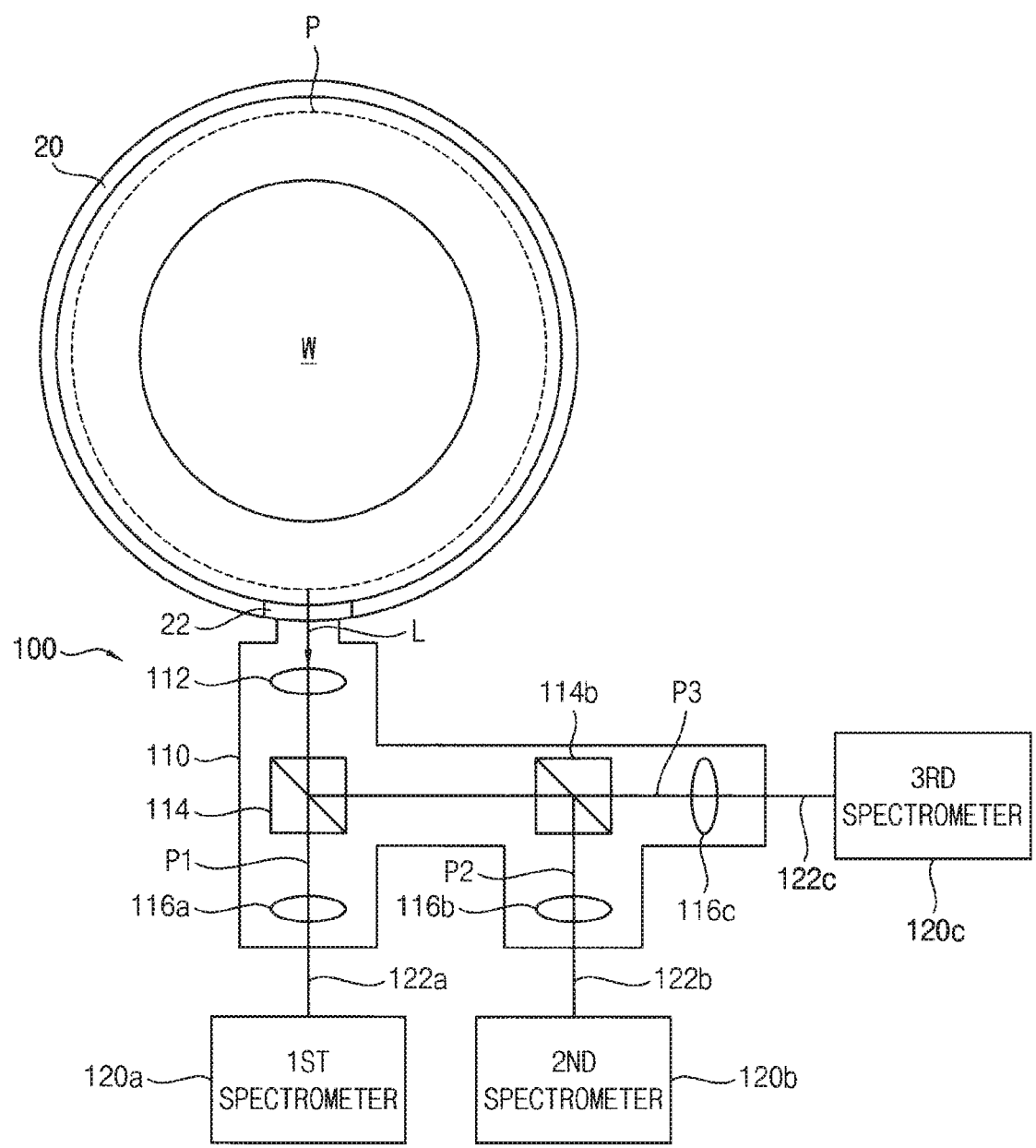
FIG. 6 is a plan view illustrating a plasma monitoring apparatus according to an example embodiment.

FIG. 6 is a plan view illustrating a plasma monitoring apparatus according to an example embodiment. The plasma monitoring apparatus 100 may be substantially the same as or similar to the plasma monitoring apparatus described with reference to FIGS. 1, 2, and 3 apart for a configuration of a light receiving optical system. Thus, same reference numerals will be used to refer to the same or like elements and any further repetitive explanation concerning the above elements will be omitted.

Referring to FIG. 6, a plasma monitoring apparatus 100 may include an objective lens 112 to collect a light L emitted from plasma P and passing through an optical window 22, a first beam splitter 114a to divide the light collected through the objective lens 112 into a first light L1 and a second light L2, a second beam splitter 114b to divide the second light into two light, such as a third light L3 and a fourth light L4, a first optical system, a second optical system, and a third optical system arranged respectively in a first optical path P1, a second optical path P2, and a third optical path P3 of the first light, third light, and fourth light, and having different focal lengths such that focal points of the first optical system, the second optical system, and the third optical system are set at different regions within the plasma, and a light detector to detect light passing through the first optical system, light passing through the second optical system, and light passing through the third optical system.

The first beam splitter 114a may be arranged along a first axis A1 downstream from the objective lens 112 to split the optical path into two, a first optical path P1 and a second optical path. The first optical path P1 may extend along the first axis A1 and the second optical path may extend along a second axis A2.

The second beam splitter 114b may be arranged along the second axis A2 downstream from the first beam splitter 114a to split the second optical path into two, a third optical path P2 and a fourth optical path P3.

The first optical system may be arranged on the optical path P1 of the first light, the third optical system may be arranged on the optical path P3 of the third light, and the fourth optical system may be arranged on the optical path P4 of the fourth light.

The first optical system may include a first optical lens 116a which is configured to have a first focal length f1 together with the objective lens 112, the second optical system may include a second optical lens 116b which is configured to have a second focal length f2 different from the first focal length f1 together with the objective lens 112, and the third optical system may include a third optical lens 116c which is configured to have a third focal length f3 different from the first focal length f1 and second focal length f2. For example, the first optical lens 116a, the second optical lens 116b, and the third optical lens 116c may respectively include a convex lens.

The first optical system may collect a first light L1 emitted from a first region, for example, a central region R1 corresponding to a diameter within the plasma P, the second optical system may collect a third light L3 emitted from a second region, for example, a peripheral region R2 within the plasma P, and the third optical system may collect a fourth light L4 emitted from a third region within the plasma P that is between the first region and the second region within the plasma.

The first optical system may collect the first light L1 from the central region R1 of the plasma P at a first viewing angle with respect to an imaginary middle line extending through the optical window 22 of the chamber 20, the second optical system may collect the third light L3 emitted from the peripheral region R2 of the plasma P at a second viewing angle greater than the first viewing angle, and the third optical system may collect the fourth light L4 from the third region of the plasma P at a third viewing angle between the first viewing angle and the second viewing angle.

The light detector may include a first spectrometer 120a to analyze the first light L1 passing through the first optical system, a second spectrometer 120b to analyze the third light L3 passing through the second optical system, and a third spectrometer 120c to analyze the fourth light L4 passing through the third optical system. The first spectrometer 120a, the second spectrometer 120b, and the third spectrometer 120c may include an optical emission spectrometer (OES).

The light converged by the first optical lens 116a may be transmitted to the first spectrometer 120a through a first light fiber 122a, the light converged by the second optical lens 116b may be transmitted to the second spectrometer 120b through a second light fiber 122b, and the light converged by the third optical lens 116c may be transmitted to the third spectrometer 120c through a third light fiber 122c. The first spectrometer 120a, the second spectrometer 120b, and the third spectrometer 120c may spectrally separate the incoming lights based on wavelengths and identify concentration levels of gases within the corresponding regions of the chamber 20.

Accordingly, plasma information in different regions may be obtained from the light passing through the single optical window 22, to thereby more precisely identify plasma distribution.

Hereinafter, a method of monitoring plasma distribution using the plasma processing system in FIG. 1 will be explained.

FIG. 7 is a flow chart illustrating a plasma monitoring method according to example embodiments.

Referring to FIGS. 1, 2, and 3, first, plasma P may be generated within a chamber 20 (S10).

In example embodiments, a wafer W may be loaded into the chamber 20 of the plasma processing apparatus 10, a plasma gas may be supplied onto the wafer, and then, the plasma P may be generated within the chamber 20.

First, the semiconductor wafer W may be loaded on an electrostatic chuck of a substrate stage 30 within the chamber 20. The process gas may then be introduced into the chamber 20 through injection holes 51 of a shower head, and then a pressure of the chamber 20 may be controlled to a desired vacuum level by a gas exhaust unit. Then, a radio frequency power may be applied to a lower electrode 34 and an upper electrode 50 to generate the plasma within the chamber 20.

Then, light L emitted from the plasma P may be collected (S12), the light L may be divided into a first light L1 and a second light L2 (S14), and light passing through first optical system and the second optical system arranged on optical paths of the first light L1 and the second light L2 may be detected (S16). Then, plasma distribution characteristics may be determined based on the detected lights (S18).

The light emitted from the plasma P and passing through an optical window 22 may be collected through an objective lens 112. The light collected through the objective lens 112 may be divided into the first light and the second light.

The first optical system and the second optical system may be arranged respectively on the first optical path P1 and the second optical path P2 of the first light and the second light. The first optical system and the second optical system may have different focal lengths such that focal points of the first optical system and the second optical system are set at different regions within the plasma. The first optical system may include a first optical lens 116a which is configured to have a first focal length f1 together with the objective lens 112, and the second optical system may include a second optical lens 116b which is configured to have a second focal length f2 different from the first focal length f1 together with the objective lens 112.

Thus, the first light L1 emitted from a first region, for example, a central region R1 within the plasma P may travel through the first optical system, and then, may be detected by a first spectrometer 120a. The second light L2 emitted from a second region, for example, a peripheral region R2 within the plasma P may travel through the second optical system, and then, may be detected by a second spectrometer 120b.

The light converged by the first optical lens 116a may be transmitted to the first spectrometer 120a through a first light fiber 122a, and the light converged by the second optical lens 116b may be transmitted to the second spectrometer 120b through a second light fiber 122b. The first spectrometer 120a and second spectrometer 120b may spectrally separate the incoming light based on wavelengths and identify concentration levels of gas within the chamber 20.

A controller 130 may process the signals detected by the first spectrometer 120a and the second spectrometer 120b to determine distribution state of the plasma P and provide the distribution information.

The above plasma monitoring apparatus and method may be may be used to manufacture semiconductor devices including logic devices and memory devices. For example, the semiconductor device may be applied to various systems such as a computing system. The semiconductor device may include Fin Field-effect transistor (finFET), dynamic random-access memory (DRAM), VNAND, etc. The system may be applied to a computer, a portable computer, a laptop computer, a personal portable terminal, a tablet, a cell phone, a digital music player, etc.

While example embodiments have been described with reference to the figures, it will be understood by those of ordinary skill in the art that various changes in form and details may be made therein without departing from the spirit and scope as defined by the following claims.

What is claimed is:

1. A plasma monitoring apparatus comprising:
   an objective lens configured to collect light that is emitted from plasma and passes through an optical window of a chamber;
   a beam splitter configured to divide the light collected by the objective lens into first light and second light;
   a first optical system and a second optical system that are provided on a first optical path of the first light and a second optical path of the second light, respectively, the first optical system having a first focal length and the second optical system having a second focal length that is different from the first focal length such that focal points of the first optical system and the second optical system are set at different regions in the plasma; and
   a light detector configured to detect the first light that has passed through the first optical system and the second light that has passed through the second optical system.

2. The plasma monitoring apparatus of claim 1, wherein the objective lens comprises a convex lens.

3. The plasma monitoring apparatus of claim 1, wherein the first optical system comprises a first optical lens configured to have a first focal length with the objective lens, and the second optical system comprises a second optical lens configured to have a second focal length that is different from the first focal length with the objective lens.

4. The plasma monitoring apparatus of claim 3, wherein the first optical lens comprises a first convex lens and the second optical lens comprises a second convex lens.

5. The plasma monitoring apparatus of claim 1, wherein the first optical system is configured to collect the first light from a peripheral region of the plasma at a first viewing angle with respect to a central line that passes through the optical window, and
   the second optical system is configured to collect the second light from a central region of the plasma at a second viewing angle that is less than the first viewing angle.

6. The plasma monitoring apparatus of claim 1, wherein the light detector comprises a first spectrometer configured to analyze the first light that has passed through the first optical system, and a second spectrometer configured to analyze the second light that has passed through the second optical system.

7. The plasma monitoring apparatus of claim 1, wherein the light detector comprises a multi channel spectrometer configured to analyze the first light that has passed through the first optical system and the second light that has passed through the second optical system.

8. The plasma monitoring apparatus of claim 1, further comprising:
   a second beam splitter provided on the second optical path of the second light, the second beam splitter being configured to divide the second light into third light and fourth light.

9. The plasma monitoring apparatus of claim 8, wherein the second optical system comprises optical lenses provided on a third optical path of the third light and a fourth optical path of the fourth light.

10. The plasma monitoring apparatus of claim 1, further comprising:
    a controller connected to the light detector, the controller being configured to provide distribution information of the plasma based on a detection of the first light and a detection of the second light by the light detector.

11. A plasma processing system comprising:
    a chamber comprising a space to perform a plasma process on a substrate and a wall comprising an optical window; and
    a plasma monitoring apparatus configured to monitor a light that is emitted from plasma and passes through the optical window, the plasma monitoring apparatus comprising:
       a beam splitter configured to divide the light into first light and second light;
       a first optical system and a second optical system that are provided on a first optical path of the first light and a second optical path of the second light, respectively, the first optical system having a first focal length and the second optical system having a second focal lengths that is different from the first focal length such that focal points of the first optical system and the second optical system are set at different regions in the plasma; and
       a light detector configured to detect the first light that has passed through the first optical system and the second light that has passed through the second optical system.

12. The plasma processing system of claim 11, wherein the plasma monitoring apparatus further comprises an objective lens configured to collect the light that is emitted from the plasma and passes through the optical window.

13. The plasma processing system of claim 12, wherein the objective lens comprises a convex lens.

14. The plasma processing system of claim 12, wherein the first optical system comprises a first optical lens configured to have a first focal length with the objective lens, and
the second optical system comprises a second optical lens configured to have a second focal length that is different from the first focal length with the objective lens.

15. The plasma processing system of claim 11, wherein the first optical system is configured to collect the first light from a peripheral region of the plasma at a first viewing angle with respect to a central line passing through the optical window, and
the second optical system is configured to collect the second light from a central region of the plasma at a second viewing angle that is less than the first viewing angle.

16. The plasma processing system of claim 11, wherein the light detector comprises a first spectrometer configured to analyze the first light that has passed through the first optical system, and a second spectrometer configured to analyze the second light that has passed through the second optical system.

17. The plasma processing system of claim 16, wherein the light detector comprises a multi channel spectrometer configured to analyze the first light that has passed through the first optical system and the second light that has passed through the second optical systems.

18. The plasma processing system of claim 11, wherein the plasma monitoring apparatus further comprises a second beam splitter provided on the second optical path of the second light, the second beam splitter being configured to divide the second light into third light and fourth light.

19. The plasma processing system of claim 18, wherein the second optical system comprises optical lenses provided on a third optical path of the third light and a fourth optical path of the fourth light.

20. The plasma processing system of claim 11, wherein the plasma monitoring apparatus further comprises a controller connected to the light detector, the controller being configured to provide distribution information of the plasma based on a detection of the first light and a detection of the second light by the light detector.

* * * * *